United States Patent
Leung et al.

(10) Patent No.: US 6,812,706 B2
(45) Date of Patent: Nov. 2, 2004

(54) AXIALLY-SEALED NMR SAMPLE TUBE ASSEMBLIES

(75) Inventors: Jimmy Leung, Fremont, CA (US); Layne Howard, Los Gatos, CA (US); James Higgins, Campbell, CA (US); Bao Nguyen, San Jose, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/387,762

(22) Filed: Mar. 12, 2003

(65) Prior Publication Data

US 2004/0178793 A1 Sep. 16, 2004

(51) Int. Cl.[7] .................................................. G01V 3/00
(52) U.S. Cl. ...................................... 324/321; 324/318
(58) Field of Search ................................ 324/321, 318, 324/309, 307

(56) References Cited

U.S. PATENT DOCUMENTS

| | | | |
|---|---|---|---|
| 2,960,649 A | 11/1960 | Bloch | 324/318 |
| 3,681,683 A | 8/1972 | Huber | 324/319 |
| 4,088,944 A | 5/1978 | Engler et al. | 324/319 |
| 4,275,350 A | 6/1981 | Hill et al. | 324/322 |
| 4,510,450 A * | 4/1985 | Brown | 324/321 |
| 4,739,270 A | 4/1988 | Daugaard et al. | 324/319 |
| 5,517,856 A * | 5/1996 | Hofmann et al. | 324/321 |
| 6,362,624 B1 * | 3/2002 | Wand et al. | 324/321 |
| 6,563,317 B2 * | 5/2003 | Warden et al. | 324/318 |
| 6,686,740 B2 * | 2/2004 | Tschirky et al. | 324/321 |

* cited by examiner

*Primary Examiner*—Brij B. Shrivastav
(74) *Attorney, Agent, or Firm*—Andrei Popovici; Bella Fishman

(57) ABSTRACT

An NMR sample tube assembly for holding a sample comprises a sample tube, a sealing plug for sealing the sample within the sample tube, and a rotor for spinning the assembly. The plug is clamped to the sample tube by an axial force. Preferably, the sample tube has a sealing flange protruding from the sample tube exterior along an inlet region of the sample tube. A filling part of the plug is sized to maintain an air escape clearance between the filling part and the sample tube for allowing air to escape out of the sample tube as the filling part is inserted therein. The rotor is secured to a protruding sealing part of the plug and clamps the sealing part to the sealing flange. The designs allow the use of wide sample tube mouths, and reduce the amount of air bubbles present in the samples during measurements.

16 Claims, 3 Drawing Sheets

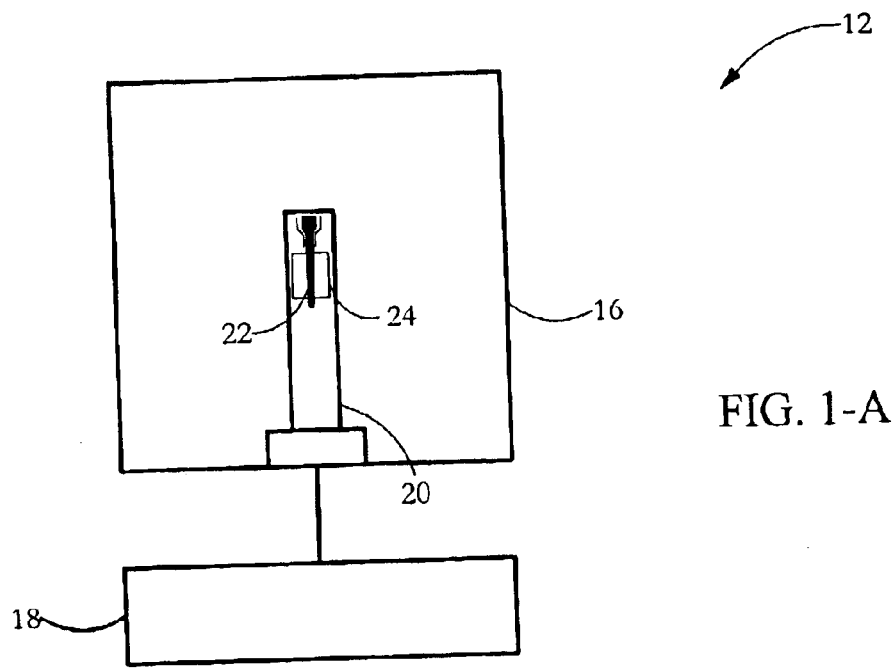
FIG. 1-A
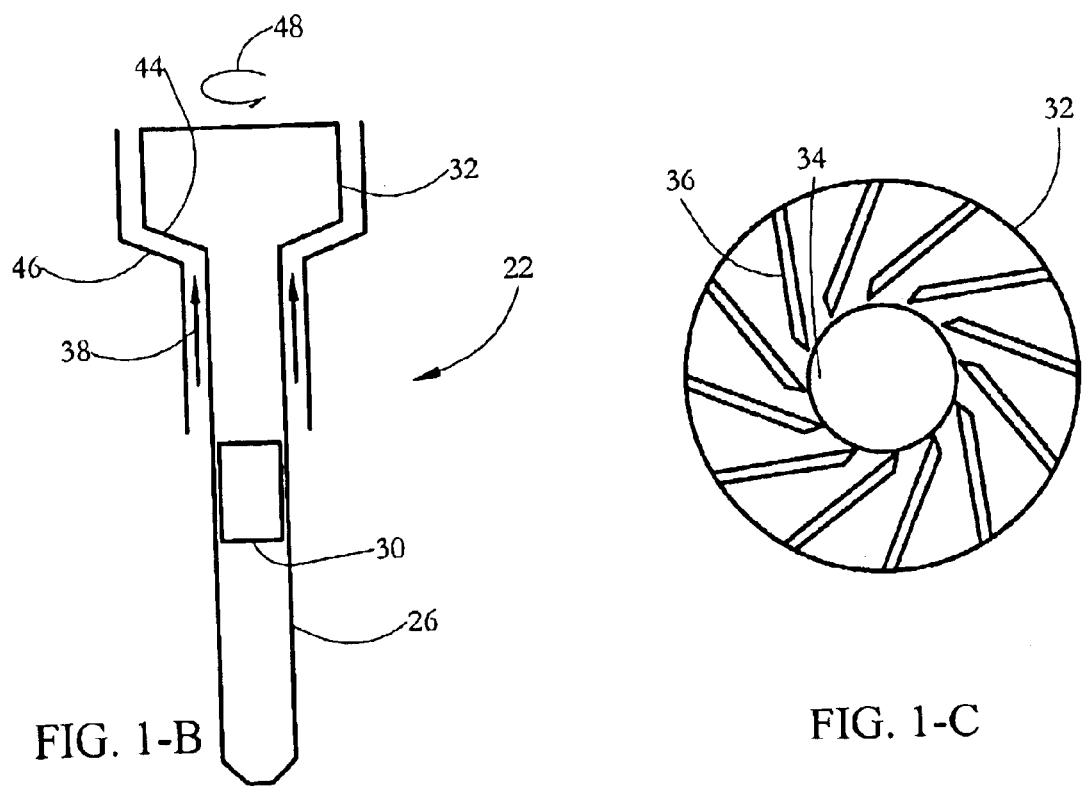
FIG. 1-B
FIG. 1-C

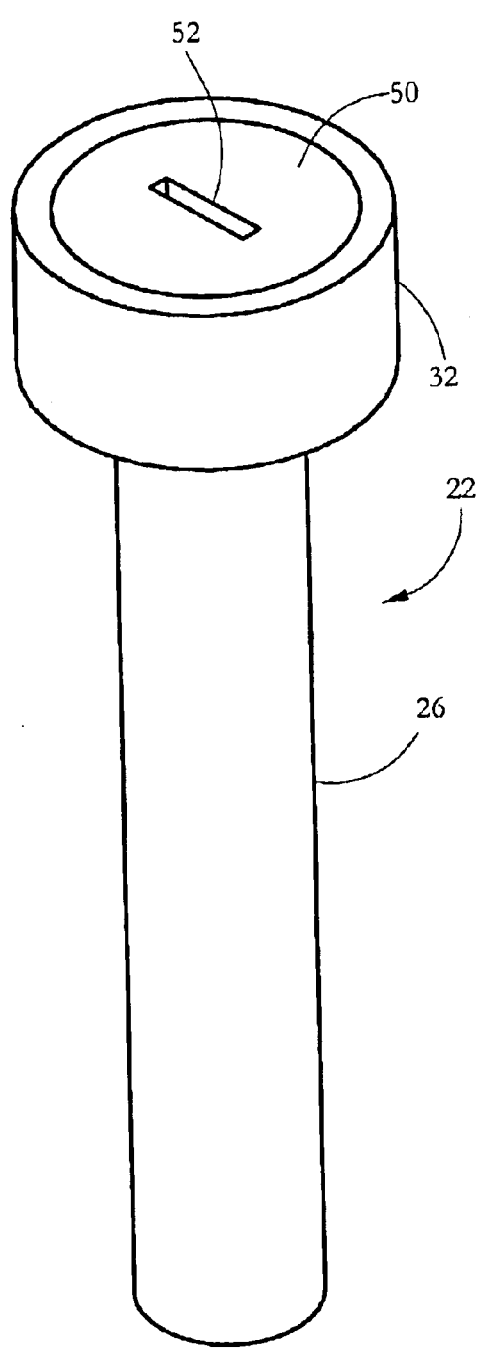
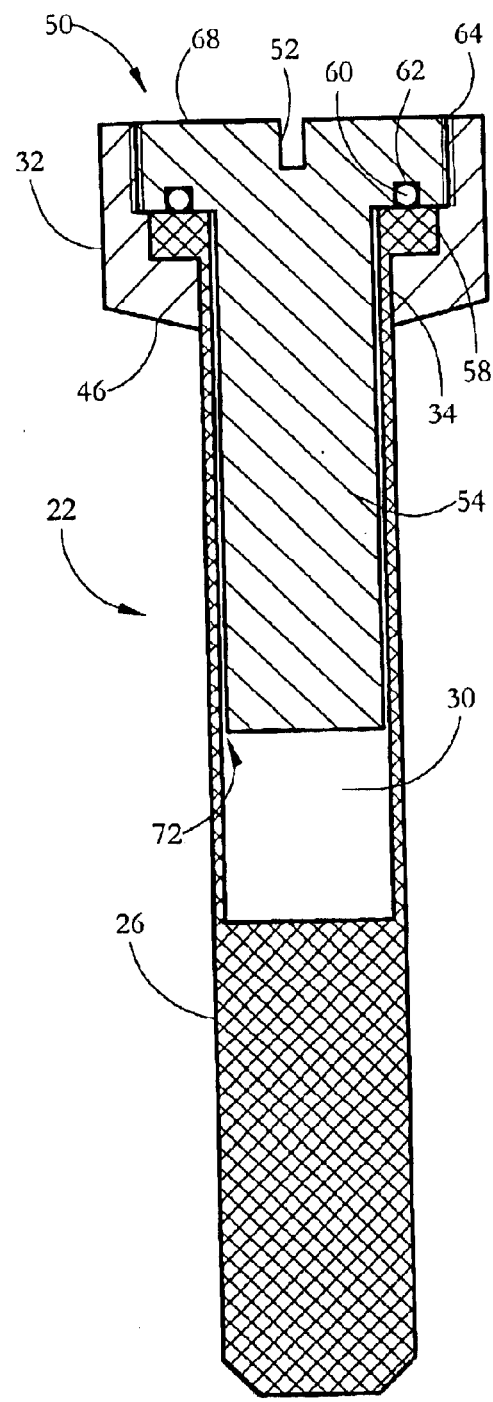
FIG. 2-A
FIG. 2-B

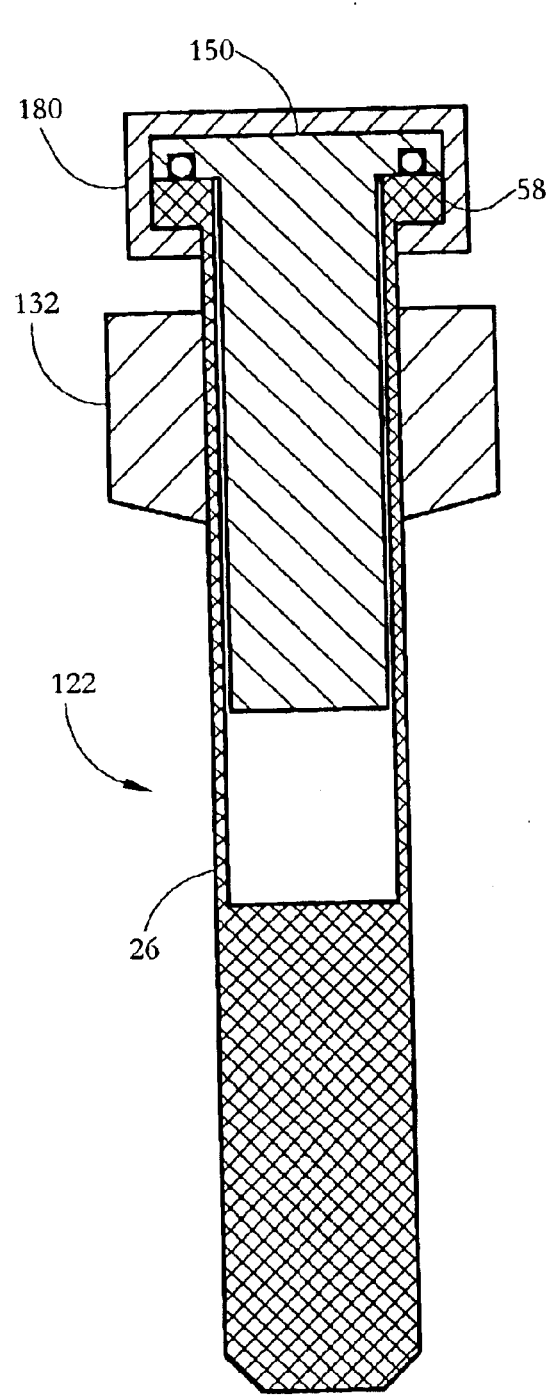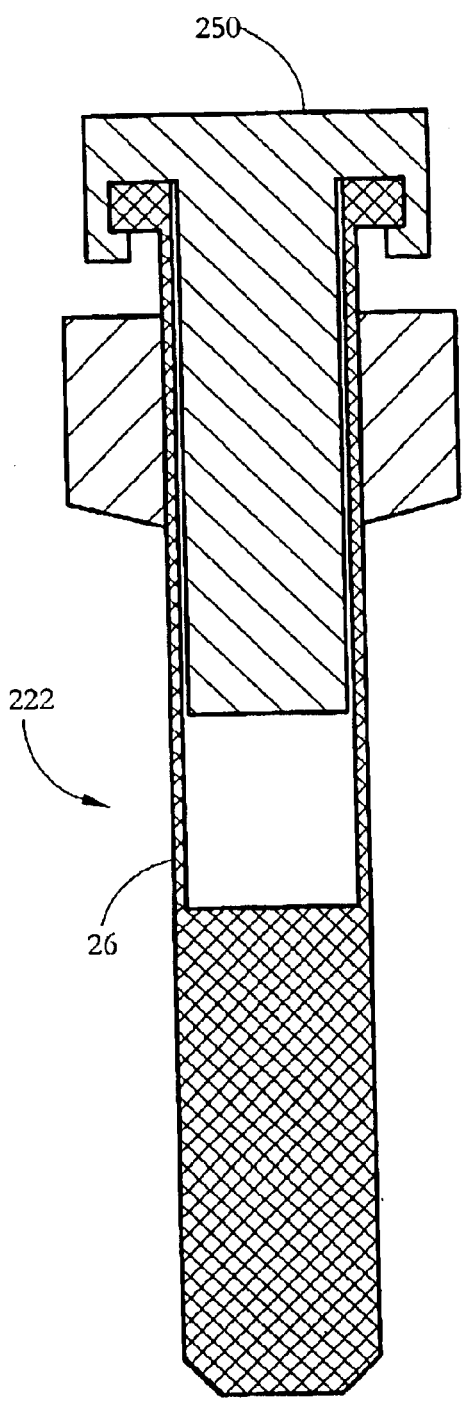
FIG. 3-A  FIG. 3-B

AXIALLY-SEALED NMR SAMPLE TUBE ASSEMBLIES

FIELD OF THE INVENTION

The invention in general relates to nuclear magnetic resonance (NMR) spectroscopy, and in particular to sample tube assemblies for NMR.

BACKGROUND OF THE INVENTION

Nuclear magnetic resonance (NMR) spectrometers typically include a superconducting magnet for generating a static magnetic field $B_0$, and an NMR probe positioned within a bore of the magnet. The NMR probe includes one or more special-purpose radio-frequency (RF) coils for applying a time-varying magnetic field $B_1$ perpendicular to the field $B_0$ to samples of interest, and for detecting the response of the samples to the applied magnetic fields. The samples of interest are normally held in sample tubes or in flow cells.

Spinning NMR sample tubes at high speeds (e.g. at a frequency of several kHz) during measurements can lead to narrower spectral linewidths. Spinning the samples causes the NMR measurements to reflect an azimuthal averaging of gradients and inhomegeneities in the magnetic fields applied to the samples. For solid polycrystalline samples, spinning also allows azimuthally averaging over the various crystalline orientations present in the sample. For solid samples, optimal spectra can be achieved when the angle between the spinning axis (the longitudinal sample axis) and the direction of the static magnetic field is the "magic angle," or about 54°. The magic angle is the solution to the equation $3\cos^2\theta - 1 = 0$. Liquid or gaseous samples are typically spun about an axis coinciding with the direction of the static magnetic field.

In a commonly-used approach, a rotor (spinner) turbine having a frusto-conical bottom surface is disposed above a matching frusto-conical stator (fixed housing). A sample tube is inserted through a central hole in the rotor, and is secured to the rotor. Running air upward along the sample tube surface causes the rotor to levitate and spin about its longitudinal axis. For further information on prior art spinning methods and/or sample tube assembly designs see for example U.S. Pat. Nos. 4,739,720, 4,275,350, 4,088,944, 3,681,683, and 2,960,649.

SUMMARY OF THE INVENTION

The present invention provides a nuclear magnetic resonance sample tube assembly for holding a nuclear magnetic resonance sample, comprising: a sample tube defining a sample holding chamber for holding the sample; a sealing plug for sealing a sample within the sample tube, comprising a generally-longitudinal filling part for filling a part of the sample tube, and a sealing part protruding transversely relative to the filling part; and a clamp for clamping the sealing part to the sample tube using a longitudinal force.

In a preferred embodiment, the clamp is a rotor for spinning the sample tube assembly. Preferably, the sample tube has a sealing flange protruding from an exterior of the sample tube along an inlet region of the sample tube. The filling part is sized to maintain an air escape clearance between the filling part and the sample tube for allowing air to escape out of the sample tube as the filling part is inserted into the sample tube. The sealing part contacts the sealing flange to seal the sample holding chamber. The rotor abuts a side of the sealing flange opposite the sealing part and secured to the sealing part, for clamping the sealing part to the sealing flange. The rotor can have a plurality of rotor blades for spinning the sample tube assembly in response to a gas flow along the same tube.

BRIEF DESCRIPTION OF THE DRAWINGS

The foregoing aspects and advantages of the present invention will become better understood upon reading the following detailed description and upon reference to the drawings where:

FIG. 1-A is a schematic diagram of an exemplary NMR spectrometer according to an embodiment of the present invention.

FIG. 1-B is a schematic diagram of a sample tube assembly of the spectrometer of FIG. 1-A.

FIG. 1-C shows a bottom view of a rotor of the sample tube assembly of FIG. 1-B.

FIG. 2-A shows an isometric view of the sample tube assembly of FIG. 1-B according to a preferred embodiment of the present invention.

FIG. 2-B shows a longitudinal sectional view of the sample tube assembly of FIG. 2-A.

FIGS. 3-A–B show longitudinal sectional views of exemplary sample tube assemblies according to the present invention.

DETAILED DESCRIPTION OF THE INVENTION

In the following description, it is understood that each recited element or structure can be formed by or be part of a monolithic structure, or be formed from multiple distinct structures. A set of elements includes one or more elements. Any reference to an element is understood to encompass one or more elements. The statement that a coil is used to perform a nuclear magnetic measurement on a sample is understood to mean that the coil is used as transmitter, receiver, or both.

The following description illustrates embodiments of the invention by way of example and not necessarily by way of limitation.

The design of NMR probes, sample tube assemblies and associated components is subject to tight spatial constraints. NMR measurement sensitivities generally improve with coil filling factors, or the fraction of coil volume taken up by sample. Consequently, NMR sample tubes often have very thin (tenths of a millimeter-thick) sample tube walls, at least along the NRM analysis window. The NMR sample tubes are normally well sealed, since spinning the sample tubes at high frequencies, and particularly around a non-vertical axis, could otherwise cause leakage of the sample.

NMR sample tube assemblies typically include a sample tube, and a plug inserted into the sample tube to seal a sample-holding volume. Conventionally, the seal between the plug and the sample tube is established between the internal surface of the sample tube and the outer surfaces of a sequence of plug rings, as shown for example in FIGS. 1-A–B of U.S. Pat. No. 4,739,270. The plug presses on the inside of the sample tube with a radial force, and there is no air gap between the plug and the inner wall of the sample tube.

Such a radial sealing approach can limit the thickness of the sample tube along the sealing area. A relatively thick sample tube wall may be required to provide sufficient mechanical stability to withstand the radial sealing force established by the plug. Requiring a thick sample tube can limit the size of the sample tube inlet aperture (mouth), and thus the size of solid objects that can be inserted into the sample tube. In a common design, the sample tube wall is relatively thin along the NMR sample analysis window, and relatively thick along the sample tube mouth. Using a thin sample tube wall along the NMR window allows achieving improved coil filling factors, while the thick sample tube wall along the sample tube mouth provides sufficient mechanical stability to support the radial sealing force exerted by the plug. In such a design, the sample chamber is capable of holding larger objects than can be inserted through the NMR sample tube mouth.

It was also observed that liquid NMR data obtained using such sample tube assemblies can be adversely affected by the presence of air bubbles in the samples. As the plug is inserted into the sample tube, the air and liquid sample present within the sample tube are compressed, and air bubbles form within the sample. Moreover, the plug insertion step can cause variability in the amount of sample present within the sample tube.

The preferred axial-sealing-force designs described below allow reducing the amount of air bubbles in the NMR samples, and also allow the use of relatively wide sample tube mouths. The sample tube can be readily scaled by users in the field. In one embodiment, sealing the sample tube also provides for the attachment of the sample tube to the rotor used to spin the sample. The preferred design was also observed to provide improved stability and vibration characteristics at high spin speeds.

FIG. 1-A is a schematic diagram illustrating a nuclear magnetic resonance (NMR) spectrometer 12 according to a preferred embodiment of the present invention. Spectrometer 12 comprises a magnet 16, an NMR probe 20 inserted in a cylindrical bore of magnet 16, and a control/acquisition system 18 electrically connected to magnet 16 and probe 20. A sample tube assembly 22 is positioned within probe 20, for holding one NMR sample of interest at a time while measurements are performed on the sample. Probe 20 includes a coil assembly having one or more radio-frequency (RF) coils 24.

Magnet 16 applies a static magnetic field $B_0$ to the sample held within sample tube assembly 22. Control/acquisition system 18 comprises electronic components for applying desired radio-frequency pulses to probe 20, and acquiring data indicative of the nuclear magnetic resonance properties of the samples within probe 20. Coils 24 are used to apply radio-frequency magnetic fields $B_1$ to the sample, and/or to measure the response of the sample to the applied magnetic fields. The RF magnetic fields are perpendicular to the static magnetic field. The same coil can be used for both applying an RF magnetic field and for measuring the sample response to the applied magnetic field. Alternatively, one coil may be used for applying an RF magnetic field, and another coil for measuring the response of the sample to the applied magnetic field.

Probe 20 preferably includes a spin gas conduit for providing an air flow to sample tube assembly 22. The incident air flow spins sample tube assembly 22 around its longitudinal axis while NMR measurements are performed. The longitudinal axis of the sample may coincide with the direction of the static magnetic field, or may form a non-zero (e.g. magic) angle with the direction of the static magnetic field. The spin frequency can be on the order of kHz, for example about 3 kHz (3000 rotations per second).

FIG. 1-B shows a longitudinal sectional view of sample tube assembly 22 and part of the probe housing (stator) supporting sample tube assembly 22 during NMR measurements. FIG. 1-C shows a bottom view of a rotor (drive ring) 32 of sample tube assembly 22. As illustrated in FIG. 1-B, sample tube assembly 22 comprises a sample tube 26 defining a sample-holding chamber 30 for holding a sample. Sample tube 26 is secured within an inner bore 34 of rotor 32, shown in FIG. 1-C. In a presently preferred embodiment, sample tube 26 is secured to rotor 32 indirectly through a sample tube plug, as described in detail below. Sample tube 26 can also be secured to rotor 32 directly, for example through a press fit.

Rotor 32 preferably includes a plurality of turbine blades 36 disposed around inner bore 34. Turbine blades 36 serve to spin rotor 32 and the rest of sample tube assembly 22 when subjected to a longitudinal air flow 38. Rotor 32 has a frusto-conical bottom surface 44, which faces a matching frusto-conical fixed stator (housing) surface 46. The rotation of rotor 32 is illustrated schematically by the arrow 48 shown in FIG. 1-B.

FIGS. 2-A–B show isometric and longitudinal sectional views of sample tube assembly 22, respectively. In the preferred implementation shown in FIGS. 2-A–B, rotor 32 acts as a clamping structure as described below. A sample sealing plug 50 comprises a volume-filling part (cylindrical member) 54, and a radially-protruding clamping/sealing part 68. Cylindrical member 54 has an outer diameter slightly smaller than the inner diameter of sample tube 26, so that an air escape clearance 72 separates cylindrical member 54 and the inner cylindrical surface of sample tube 26. Sample tube 26 comprises an annular sealing flange or lip 58 protruding externally from the cylindrical body of sample tube 26 along its inlet opening. Preferably, the diameter of the inlet opening of sample tube 26 is identical to or larger than the diameter of sample tube 26 along sample holding chamber 30.

Clamping part 68 is clamped down onto flange 58 by rotor 32. Rotor 32 extends under flange 58, and is secured to plug 50 by a mating helical thread 64. A keyed aperture 52 situated along the top surface of plug 50 allows plug 50 and rotor 32 to be tightened together, thus securing sample tube 26, plug 50 and rotor 32 in a tight rotatable assembly. Keyed aperture 52 can be for example a slot or hexagonal aperture. An annular sealing O-ring groove 62 is defined along the lower surface of clamping part 68, for accommodating a compressed O-ring 60 between clamping part 68 and flange 58.

The various components of sample tube assembly 22 are preferably made of NMR-compatible materials known in the art. Sample tube 26 is preferably made of a borosilicate glass (pyrex®), a ceramic such as toughened zirconia, or quartz. Plug 50 is preferably made of a soft, flexible elastomer or plastic such as polychlorotrifluoroethylene (PCTFE, or Kel-f®). Rotor 32 is preferably made of a plastic or polymer such as polyoxymethylene (Delrin® acetal resin), polymethylmetracrylate (PMMA), PCTFE, or polyamide-imide (PAI, or Torlon®). O-ring 60 can be made of a plastic or an elastomer such as Viton® fluoroelastomer.

Sample tube 26 preferably has a length on the order of cm to tens of cm, e.g. about 10 cm or 20 cm. The outer diameter of sample tube 26 can be on the order of mm, preferably 3 mm to 5 mm, e.g. about 4 mm. The wall thickness of sample tube 26 is preferably on the order of several tenth of mm, for example less than about 0.5 mm. In a present implementation, sample tube 26 has a 4 mm outer diameter, a wall thickness of 0.4 mm, and a 3.2 mm inner diameter. The outer diameter of cylindrical member 54 is preferably smaller than the inner diameter of sample tube 26 by a size on the order of tenths of mm or less. Flange 58 preferably has an axial extent on the order of mm, e.g. about 1–2 mm, and a radial extent on the order of mm, for example about 1 mm or less. O-ring 60 preferably has a thickness on the order of 1 mm. Sample chamber 30 preferably has a volume on the order of tens to hundreds of microliters, for example about 40 μl.

Preferably, to perform an NMR measurement on a sample, sample tube 26 is slightly overfilled with a quantity of sample exceeding the volume of sample holding chamber 30. Sample tube 26 is slid through the central aperture of rotor 32 until the bottom of flange 58 abuts rotor 32. O-ring 60 is placed into groove 62, and plug 50 is inserted into sample tube 26 slowly, displacing air and excess sample out of sample tube 26 along air escape clearance 72. Plug 50 is then screwed into rotor 32 until plug 50, rotor 32, and sample tube 26 form a secure sample tube assembly. Sample tube assembly 22 is then inserted into the NMR probe of an NMR spectrometer, drive air is flowed through rotor 32 to spin up sample tube assembly 22, and NMR measurements are performed on the sample.

FIGS. 3-A and 3-B show longitudinal sectional views of sample tube assemblies 122, 222 according to alternative embodiments of the present invention. Sample tube assembly 122 differs from the assembly of FIGS. 2-A–B in that a flexible clamp 180 is provided as a separate structure from a rotor 132. Clamp 180 is disposed on top of a plug 150 and snapped into place around flange 58. Rotor 132 is separately secured to the outside surface of sample tube 26, for example by a tight press fit. Sample tube assembly 222 differs from the tube assembly 122 of FIG. 3-A in that a plug and clamping structure are formed together as part of a monolithic piece 250, and an O-ring is not used between piece 250 and sample tube 26.

The present invention further provides kits for allowing end users to assemble sample tube assemblies as described above. Such a kit may include an NMR rotor and matching sample plug, O-ring, and NMR sample tube having a suitable flange or other clamping protrusion for axially-sealing the sample tube. Such a kit may also include a clamp provided separately from the NMR rotor, a sample plug, an O-ring, and an NMR sample tube.

It will be clear to one skilled in the art that the above embodiments may be altered in many ways without departing from the scope of the invention. Clamping protrusions may have shapes that are not continuously annular, such as slotted annular protrusions or protrusions extending away from the sample tube body only at several sample tube azimuthal locations. A clamping flange may be provided at a distance away from the sample tube lip, particularly if the inlet aperture of the sample tube is narrower than the sample chamber. A clamp may be used to snap into a groove defined in the sample tube, or within or under a ring secured to the sample tube. The inlet aperture (mouth) of the sample tube may be narrower than the sample chamber. A clamp may be provided as part of a rotor or as a separate structure. A rotor may not have blades, particularly if spinning air is provided tangentially. Accordingly, the scope of the invention should be determined by the following claims and their legal equivalents.

What is claimed is:

1. A nuclear magnetic resonance sample tube assembly for holding a nuclear magnetic resonance sample, comprising:
   a sample tube defining a sample holding chamber for holding the nuclear magnetic resonance sample, the sample tube having a sealing flange protruding from an exterior of the sample tube along an inlet region of the sample tube;
   a sealing plug for sealing a sample within the sample tube, comprising
      a generally-longitudinal filling part for filling a part of the sample tube, sized to maintain an air escape clearance between the filling part and the sample tube for allowing air to escape out of the sample tube as the filling part is inserted into the sample tube, and
      a sealing part protruding transversely relative to the filling part, for contacting the sealing flange to seal the sample holding volume; and
   a rotor abutting a side of the sealing flange opposite the sealing part and secured to the sealing part, for clamping the sealing part to the sealing flange and for spinning the sample tube assembly in response to a gas flow incident on the rotor.

2. The sample tube assembly of claim 1, further comprising a sealing O-ring disposed in a groove defined at an interface between the sealing part and the sealing flange.

3. The sample tube assembly of claim 1, wherein the sample tube is formed of a material selected from the group consisting of borosilicate glass, ceramic, and quartz.

4. The sample tube assembly of claim 3, wherein the sealing plug is formed of an elastomer.

5. The sample tube assembly of claim 1, wherein an inner diameter of the sample tube along the inlet region is substantially equal to an inner diameter of the sample tube along the sample-holding chamber.

6. The sample tube assembly of claim 5, wherein the sample tube has a wall thickness less than or equal to 0.5 mm along the sample-holding chamber.

7. The sample tube assembly of claim 1, wherein the rotor and the sealing part have matching helical threads, for screwing the sealing part into the rotor.

8. The sample tube assembly of claim 7, wherein the sealing part has a keyed aperture defined along a side of the sealing part opposite the filling part, for rotating the sealing plug around a longitudinal axis.

9. A nuclear magnetic resonance sample tube assembly for holding a nuclear magnetic resonance sample, comprising:
   a sample tube defining a sample holding chamber for holding the nuclear magnetic resonance sample;
   a sealing plug for sealing a sample within the sample tube, comprising
      a generally-longitudinal filling part for filling a part of the sample tube, and
      a sealing part protruding transversely relative to the filling part; and
   a clamp for clamping the sealing part to the sample tube using a longitudinal force,
      wherein the filling part is sized to maintain an air escape clearance between the filling part and the sample tube for allowing air to escape out of the sample tube as the filling part is inserted into the sample tube.

10. The sample tube assembly of claim 9, wherein the sealing plug and the clamp are integrally formed from a single monolithic piece.

11. The sample tube assembly of claim 9, wherein the clamp comprises a rotor for spinning the sample tube assembly in response to a gas flow incident on the rotor.

12. A method of sealing a nuclear magnetic resonance sample within a sample tube, comprising:
 inserting the sample into a sample holding chamber defined by the sample tube; and
 sealing the sample holding volume by
  inserting a filling part of a sealing plug into the sample tube;
  sizing the filling part to maintain an air escape clearance between the filling part and the sample tube for allowing air to escape out of the sample tube as the filling part is inserted into the sample tube, and
  clamping a sealing part of the sealing plug to the sample tube using a longitudinal force.

13. The method of claim 12, further comprising performing a nuclear magnetic resonance measurement on the sample while the sample is sealed in the sample-holding chamber.

14. The method of claim 13, further comprising spinning the sample tube around a longitudinal sample tube axis while performing the nuclear magnetic resonance measurement.

15. A method of performing nuclear magnetic resonance measurements on a liquid nuclear magnetic resonance sample, comprising:
 inserting the liquid sample into a sample holding volume defined by a sample tube;
 sealing the sample holding volume by
  inserting a filling part of a sealing plug into the sample tube;
  sizing the filling part to maintain an air escape clearance between the filling part and the sample tube for allowing air to escape out of the sample tube as the filling part is inserted into the sample tube; and
  clamping a sealing part of the sealing plug to the sample tube using a longitudinal force; and
 applying a magnetic field to the sample while the sample is held in the sample tube, to measure an interaction of the sample with the magnetic field.

16. A nuclear magnetic resonance sample tube assembly for holding a nuclear magnetic resonance sample, comprising:
 sample holding means defining a sample holding chamber for holding the sample;
 means for sealing a sample within the sample holding chamber, comprising
  filling means for filling a part of the sample-holding chamber, and
  sealing means for sealing the sample-holding chamber; and
 means for clamping the sealing means to the sample holding means using a longitudinal force,
 wherein the filling means is sized to maintain an air escape clearance for allowing air to escape out of the sample holding means as the filling means is inserted into the sample holding means.

* * * * *